United States Patent
Stakely et al.

(10) Patent No.: US 8,014,968 B2
(45) Date of Patent: *Sep. 6, 2011

(54) SELF-TEST CIRCUIT FOR HIGH-DEFINITION MULTIMEDIA INTERFACE INTEGRATED CIRCUITS

(75) Inventors: Barry L. Stakely, Snow Camp, NC (US); Rodney D. Miller, Kennersville, NC (US); Jingang Yi, Beijing (CN)

(73) Assignee: Analog Devices, Inc., Norwood, MA (US)

( * ) Notice: Subject to any disclaimer, the term of this patent is extended or adjusted under 35 U.S.C. 154(b) by 32 days.

This patent is subject to a terminal disclaimer.

(21) Appl. No.: 12/567,324

(22) Filed: Sep. 25, 2009

(65) Prior Publication Data

US 2010/0023825 A1 Jan. 28, 2010

Related U.S. Application Data

(63) Continuation of application No. 11/403,082, filed on Apr. 12, 2006, now Pat. No. 7,617,064.

(60) Provisional application No. 60/670,515, filed on Apr. 12, 2005.

(51) Int. Cl.
*G06F 11/00* (2006.01)
*G06F 19/00* (2006.01)
(52) U.S. Cl. ...... 702/117; 73/865.8; 324/73.1; 324/537; 702/182; 714/32
(58) Field of Classification Search .......... 73/865.9; 324/73.1, 118, 500, 537, 763, 763.01; 702/1, 702/33, 34, 57, 108, 117, 124, 127, 182; 714/1, 25, 33, 100, 32

See application file for complete search history.

(56) References Cited

U.S. PATENT DOCUMENTS

| 2,950,437 | A | | 8/1960 | Stahl |
| 2,996,666 | A | | 8/1961 | Baker |
| 3,082,374 | A | * | 3/1963 | Buuck ........................ 324/73.1 |
| 3,219,927 | A | | 11/1965 | Topp et al. |

(Continued)

FOREIGN PATENT DOCUMENTS

JP 10-206506 A * 8/1998

OTHER PUBLICATIONS

HDMI Press: "Silicon Image Sets the Standard for Digital Consumer Electronic Interfaces with Panellink Cinema, the World's First HDMI Transmitter and Receiver", Jan. 9, 2003, from hdmi.org/press/pr/pr_20030109.aspx (downloaded Mar. 20, 2009).*

*Primary Examiner* — Edward R Cosimano
(74) *Attorney, Agent, or Firm* — Kenyon & Kenyon LLP

(57) ABSTRACT

A high-definition multimedia interface circuit uses a high-definition multimedia interface encoder to produce a plurality of channels of data. An output circuit, connected to the high-definition multimedia interface encoder, produces a plurality of channels of high frequency data from the data produced by the high-definition multimedia interface encoder. A multiplexer selects a channel for sampling, and a capacitive coupler capacitively couples the multiplexer to a sampling circuit. The sampling circuit produces sampled data corresponding to the high frequency data having a clock rate less than a clock rate of the high frequency data. A test circuit compares the sampled data with the data produced by the high-definition multimedia interface encoder.

16 Claims, 4 Drawing Sheets

U.S. PATENT DOCUMENTS

| | | | |
|---|---|---|---|
| 3,764,995 A * | 10/1973 | Helf et al. | 714/32 |
| 3,976,940 A | 8/1976 | Chau et al. | |
| 4,057,847 A | 11/1977 | Lowell et al. | |
| 4,092,589 A * | 5/1978 | Chau et al. | 714/736 |
| 4,285,059 A * | 8/1981 | Burlage et al. | 714/736 |
| RE31,056 E * | 10/1982 | Chau et al. | 714/700 |
| 5,473,618 A | 12/1995 | Takeshita et al. | |
| 5,920,340 A * | 7/1999 | Man et al. | 348/181 |
| 6,057,679 A | 5/2000 | Slizynski et al. | |
| 6,154,715 A | 11/2000 | Dinteman et al. | |
| 6,246,971 B1 * | 6/2001 | Kermani et al. | 702/119 |
| 6,345,373 B1 * | 2/2002 | Chakradhar et al. | 714/738 |
| 6,396,536 B1 * | 5/2002 | Howell et al. | 348/180 |
| 6,998,851 B2 | 2/2006 | van Spengen | |
| 7,047,442 B2 | 5/2006 | Sutton | |
| 7,203,875 B2 | 4/2007 | Syed | |
| 7,266,739 B2 | 9/2007 | Syed | |
| 7,337,381 B2 | 2/2008 | Fujisaki | |
| 7,617,064 B2 * | 11/2009 | Stakely et al. | 702/117 |
| 7,878,907 B2 * | 2/2011 | Davis et al. | 463/40 |
| 2003/0200483 A1 | 10/2003 | Sutton | |
| 2003/0223526 A1 | 12/2003 | Sorna | |
| 2004/0070400 A1 | 4/2004 | van Spengen | |
| 2005/0022080 A1 | 1/2005 | Syed | |
| 2005/0022081 A1 | 1/2005 | Syed | |
| 2006/0026482 A1 | 2/2006 | Fujisaki | |
| 2006/0258459 A1 * | 11/2006 | Davis et al. | 463/40 |
| 2006/0274563 A1 * | 12/2006 | Stakely et al. | 365/63 |

* cited by examiner

SELF-TEST CIRCUIT FOR HIGH-DEFINITION MULTIMEDIA INTERFACE INTEGRATED CIRCUITS

PRIORITY INFORMATION

This is a continuation of application Ser. No. 11/403,082 filed Apr. 12, 2006, now U.S. Pat. No. 7,617,064, the contents of which are incorporated herein by reference in its entirety. The present patent application also claims priority under 35 U.S.C §119 from U.S. Provisional Patent Application Ser. No. 60/670,515, now expired, filed on Apr. 12, 2005. The entire content of U.S. Provisional Patent Application Ser. No. 60/670,515, filed on Apr. 12, 2005 is hereby incorporated by reference.

FIELD OF THE PRESENT INVENTION

The present invention is directed to a system and method for testing high-definition multimedia interface integrated circuits. More particularly, the present invention is directed to a system and method for testing high-definition multimedia interface integrated circuits at high frequencies without causing electrostatic discharge protection degradation.

BACKGROUND OF THE PRESENT INVENTION

Digital visual interface and high-definition multimedia interface are high speed serial interconnect standards to transmit graphical data from a source to some type of display. The standards operate over a large range of data rates at very low differential voltage levels. The interface connection is limited to relatively short distance due to the combination of high data rates (250 Mb/s to 1.65 GB/s), low voltage swings (800 mV), reflections with the signal due to cable and connectors, and compatibility issues between manufactures of the transmitters and receivers.

FIG. 1 illustrates an example of this conventional system. In FIG. 1, a digital video source 20 is connected to a display device 30 through a cable 1. This system requires a specialize interface to establish a link between the source 20 and display 30.

With respect to another example of a conventional digital visual interface and/or high-definition multimedia interface system, the data transfer system sends data back and forth from point A to point B; however, the data transfer system does not send the same amount of data in one direction as in the other direction. More specifically, in the conventional system, Point A could be sending data at 2 Gb/s to point B, but Point B is only sending 1 Mb/s of data to Point A. Typically, this type of system would require two channels, one for the high speed downstream data and one for low speed upstream data, or a single mode system that creates bi-directional data stream, which adds additional circuitry.

Moreover, graphic applications operate at different clock rates for different display resolutions. However, in many data transfer architectures it is beneficial to transmit the data at a fixed data rate. The problem in realizing this benefit is providing an adequate conversion of the variable rate data being received by the converter to a fixed data rate for actual transmission, and then a conversion of the fixed rate data back to a variable rate data without loss.

In providing a digital visual interface and/or high-definition multimedia interface system, the integrated circuits associated with the interfaces need to be tested to ensure proper signal quality. Moreover, this testing needs to be done at operational speeds to ensure that the testing procedures can reliably identify problems.

There are several problems associated with testing the integrated circuits associated with the digital visual interface and/or high-definition multimedia interfaces. More specifically, one problem with testing of 1.65 GHz signals is using a generic digital tester. At gigahertz frequencies, it is difficult to produce quality signals over process, temperature, and voltage using CMOS-only chips.

More particularly, in the case of a high-definition multimedia interface, several signal quality specifications must be met in regards to rise times, fall times, jitter, duty cycle, etc. Any test circuit output loading, which results in degradation of signal quality, must be kept at a minimum since normal operation must not be adversely affected.

Another problem associated with testing the integrated circuits associated with the digital visual interface and/or high-definition multimedia interfaces is that a conventional sampled-data muxing circuit, such as a sample-and-hold, cannot be used. Conventional sample-muxing circuits; i.e., the circuit connecting the output drivers to the test circuit; does not operate in a continuous-time mode nor have a high bandwidth.

Moreover, the test circuitry must be high speed, small in area since it is not used in normal operation, robust so that chip yields do not suffer, and have a higher accuracy than the output stage so that false test failures are not generated. Conventionally if the test circuitry can meet the high speed requirement, the conventional test circuitry is not robustness, small area, or accurate.

A further problem associated with testing the integrated circuits associated with the digital visual interface and/or high-definition multimedia interfaces is the relatively high external termination voltage. For high-definition multimedia interfaces, the termination voltage is 3.3V, while the conventional chip supply voltage is 1.8V. Furthermore, the mux circuit must be able to operate at an input voltage of 3.3V, while being controlled by 1.8V logic. This voltage difference can negatively impact both normal operations and chip power-down because the voltage disparity can cause current to be drawn from the output pads by the mux. Also, conventional test circuitry is not able to process signals with a common-mode voltage higher than the 1.8V circuit supply voltage with good accuracy and without device failure due to high voltage fields.

Additionally, conventional test circuitry must be provided electrostatic discharge protection which generally lowers the frequency response of the circuitry. When providing a high speed test path, gates of a conventional mux circuit cannot be used in the signal path of the outputs to the sampling circuit since gates are CMOS devices. A CMOS device gate can only be connected to such an output pad through resistors. Since the resistors are large to prevent the test circuit from causing electrostatic discharge failures, the electrostatic discharge protection resistors lower the signal bandwidth. Thus, the electrostatic discharge problem limits circuit topologies for the mux circuit.

Thus, it is desirable to a testing circuitry which will not have a negative impact upon normal circuit behavior. Moreover, it is desirable to a testing circuitry which will not have an electrostatic discharge problem. Furthermore, it is desirable to a testing circuitry which will have a small area, be accurate, and robust. Also, it is desirable to a testing circuitry which is capable of making measurements of signals having voltages greater than the chip supply. Lastly, it is desirable to a testing circuitry which provides high and low speed functional testing of an analog dynamic signal path.

SUMMARY OF THE PRESENT INVENTION

One aspect of the present invention is a high-definition multimedia interface circuit. The high-definition multimedia interface circuit includes a high-definition multimedia interface encoder to produce first data; an output circuit, operatively connected to the high-definition multimedia interface encoder, to produce high frequency data from the first data; a capacitive coupler, operatively connected to the output circuit; a sampling circuit, operatively connected to the capacitive coupler, to produce sampled data corresponding to the high frequency data; and a test circuit, operatively connected to the sampling circuit, to compare the sampled data with the first data.

Another aspect of the present invention is a high-definition multimedia interface circuit. The high-definition multimedia interface circuit includes a high-definition multimedia interface encoder to produce first data; an output circuit, operatively connected to the high-definition multimedia interface encoder, to produce high frequency data from the first data; a sampling circuit, operatively connected to the output circuit, to produce sampled data corresponding to the high frequency data having a clock rate less than a clock rate of the high frequency data; and a test circuit, operatively connected to the sampling circuit, to compare the sampled data with the first data.

A further aspect of the present invention is a high-definition multimedia interface circuit. The high-definition multimedia interface circuit includes a high-definition multimedia interface encoder to produce a plurality of channels of first data; an output circuit, operatively connected to the high-definition multimedia interface encoder, to produce a plurality of channels of high frequency data from the first data; a multiplexer, operatively connected to the output circuit, to select a channel for sampling; a capacitive coupler, operatively connected to the multiplexer; a sampling circuit, operatively connected to the capacitive coupler, to produce sampled data corresponding to the high frequency data having a clock rate less than a clock rate of the high frequency data; and a test circuit, operatively connected to the sampling circuit, to compare the sampled data with the first data.

Another aspect of the present invention is a method of selecting a proper phase of a transmit clock of a high-definition multimedia interface circuit for providing automatic at-speed testing. The method selects a first phase of a transmit clock of a high-definition multimedia interface circuit; measures a bit error rate; selects the first phase of a transmit clock of a high-definition multimedia interface circuit as the proper phase for testing if the measured bit error rate is zero; selects another phase of a transmit clock of a high-definition multimedia interface circuit if the measured bit error rate is non-zero; measures a new bit error rate; and repeats the selection of another phase of a transmit clock of a high-definition multimedia interface circuit and measuring a new bit error until a specific phase selection produces zero bit errors.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
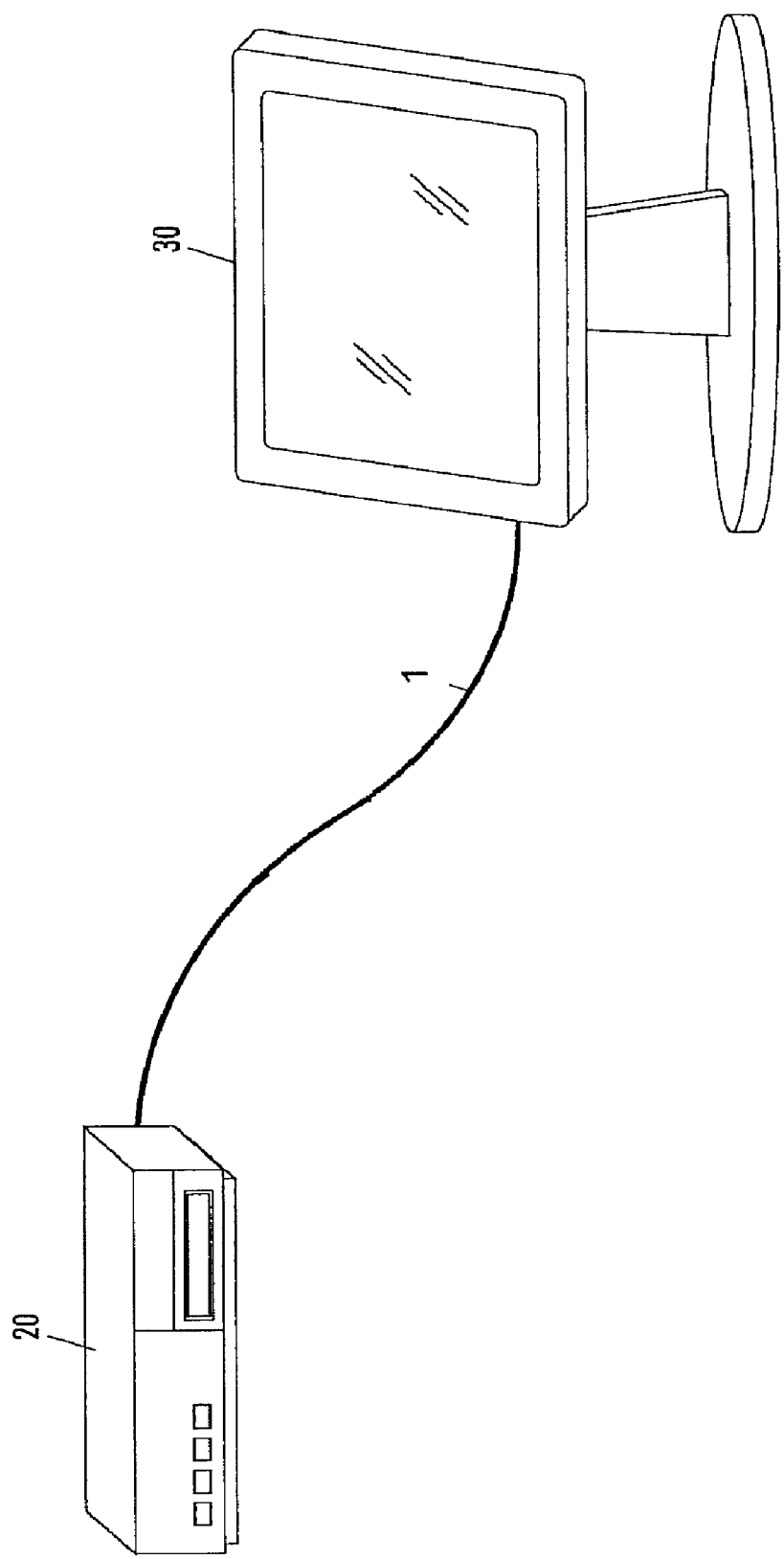
FIG. 1 illustrates a prior art digital video data source/display system.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, it is desirable to a testing circuitry which will not have a negative impact upon normal circuit behavior. Moreover, it is desirable to a testing circuitry which will not have an electrostatic discharge problem. Furthermore, it is desirable to a testing circuitry which will have a small area, be accurate, and robust. Also, it is desirable to a testing circuitry which is capable of making measurements of signals having voltages greater than the chip supply. Lastly, it is desirable to a testing circuitry which provides high and low speed functional testing of an analog dynamic signal path.

To realize such a testing system, the present invention utilizes a built-in-self test circuit described below to test digital visual interface and/or high-definition multimedia interface chips at a high frequency. For example, the present invention may enable the testing of digital visual interface and/or high-definition multimedia interface chip at a maximum rate of 1.6 GHz and a minimum rate of 25 MHz.

Figure 2:
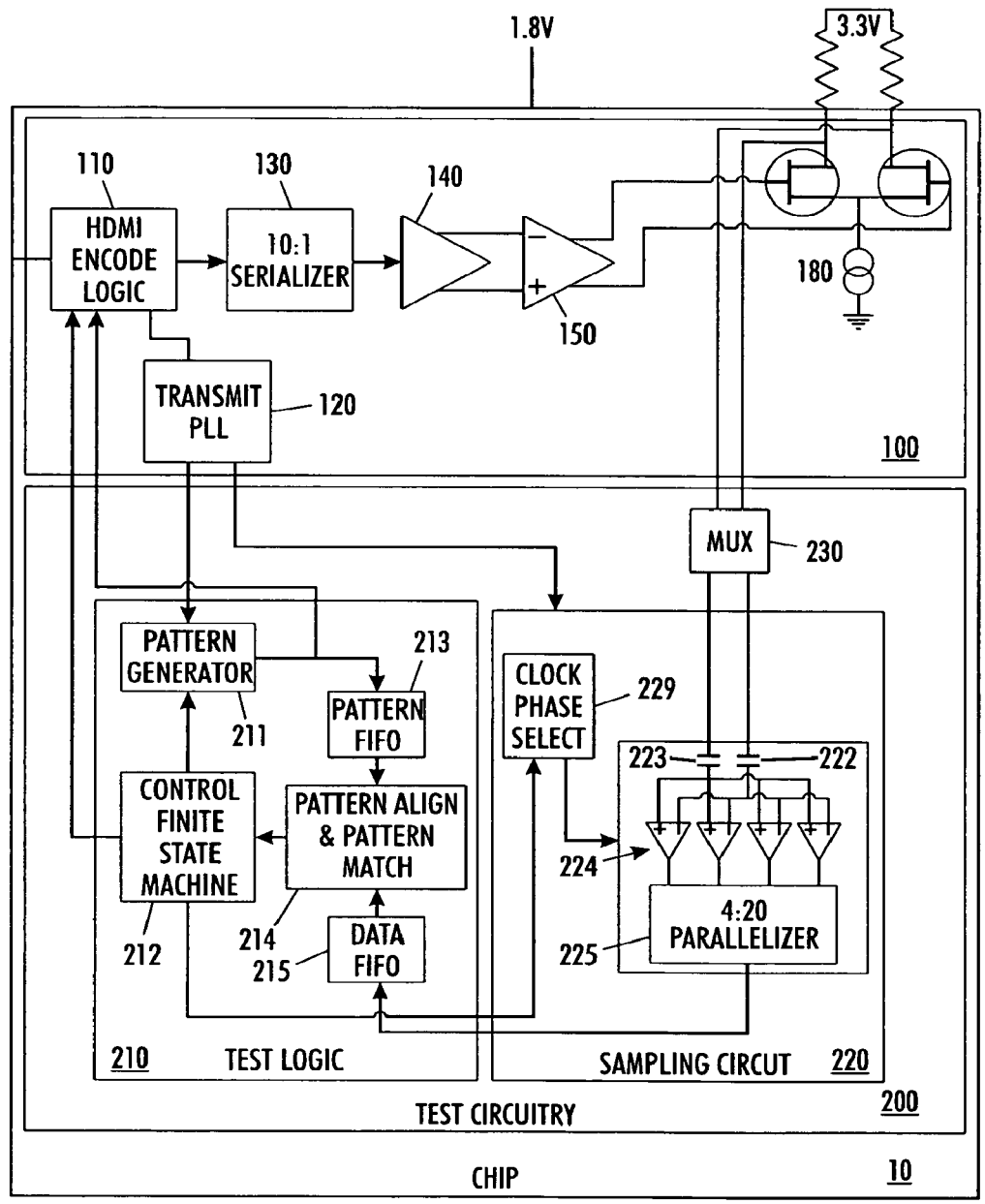
FIG. 2 illustrates an integrated chip for a high-definition multimedia interface with a built-in self test circuit according to the concepts of the present invention.

FIG. 2 illustrates an integrated chip for a high-definition multimedia interface with a built-in self test circuit according to the concepts of the present invention. As illustrated in FIG. 2, an integrated chip 10 includes a high-definition multimedia interface 100 and self test circuit 200.

The high-definition multimedia interface 100 includes a high-definition multimedia interface encoder 110 which produces the header information from the timing information and encodes the multiple channels of graphic data; e.g., red, green and blue channels of data. The high-definition multimedia interface encoder 110 further transmits the header information with the graphic data and the appropriate idle codes, when necessary, to the serializer 130. The serializer 130 multiplexes information to create a serial data stream having a fixed data rate.

The serial data stream having a fixed data rate is converted to a stream of pulses by drivers 140 and 150 and a high frequency switching circuit 180. The pulses are fed over a cable (not shown) so as to be eventually displayed on a display device or received by another electronic data device.

Moreover, the high-definition multimedia interface 100 includes a transmit phase-locked loop circuit 120.

As noted above, the integrated chip 10 includes self test circuit 200. Self test circuit 200 includes a test circuit 210, a mux circuit 230, and a sampling circuit 220. The sampling circuit 220 provides high bandwidth operation, robustness, accuracy, ability to measure signals having voltages above the voltage supply of the chip 10, and a small footprint on the chip 10.

Figure 4:
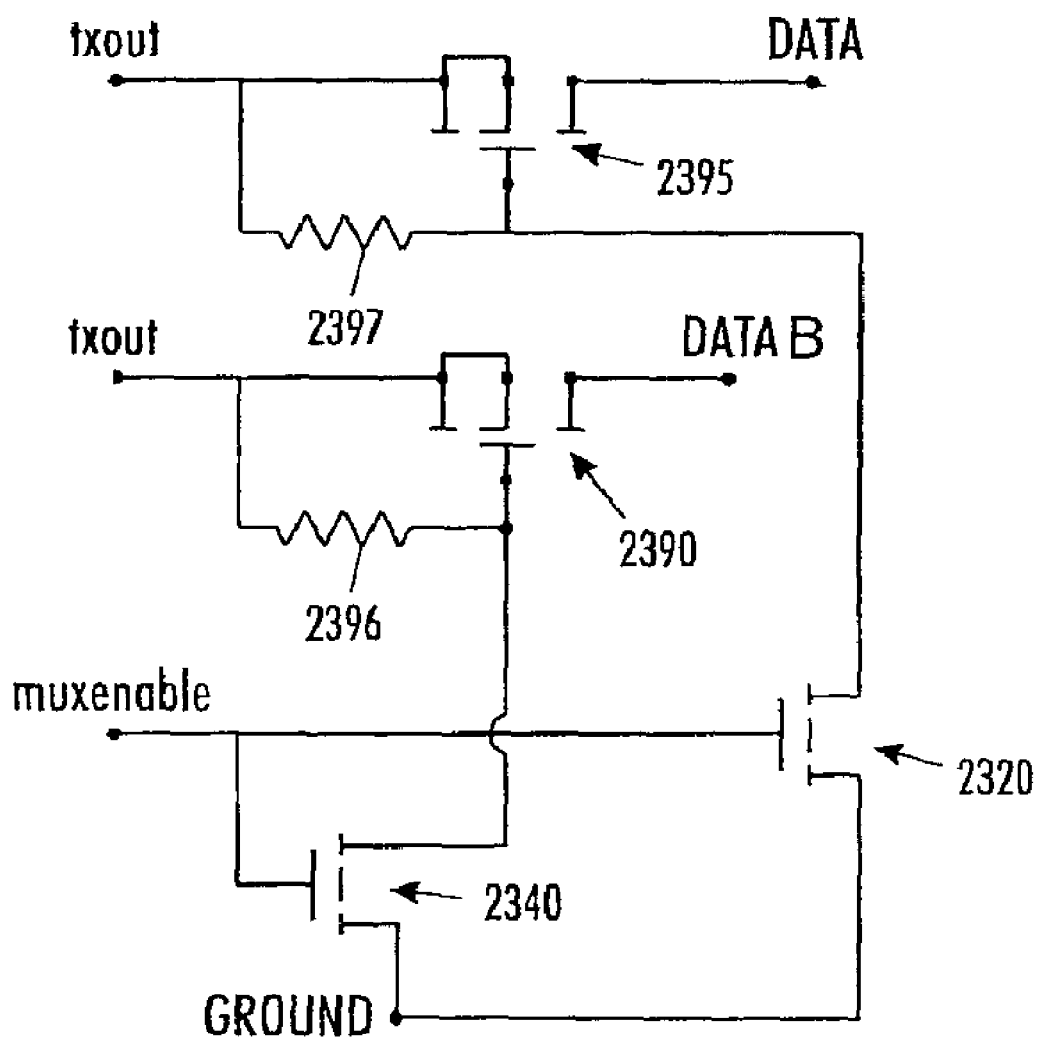
FIG. 4 illustrates a mux circuit according to the concepts of the present invention.

The mux circuit 230 illustrates in more detail by FIG. 4. The mux circuit 230 provides high bandwidth for the signal path, high impedance when not in the test mode, low loading of the output pad, high input voltage tolerance relative to the voltage supply of the chip 10, and good electrostatic discharge protection.

As illustrated in FIG. 4, the mux circuit 230 provides high impedance when the mux circuit 230 is OFF. More specifically, the resistors 2396 and 2397 from the gates of PMOS transistors 2390 and 2395 to the input terminal of PMOS transistors 2390 and 2395, respectively, will set the PMOS Vgs to zero when transistors 2340 and 2320 are OFF. Since the resistors 2396 and 2397 are not in the signal path, the resistors 2396 and 2397 can be large to both minimize current draw during the test mode and to provide excellent electrostatic discharge protection to the gates.

When the NMOS transistors 2340 and 2320 are ON, the very small device currents across the large resistors 2396 and 2397 turn the PMOS transistors 2390 and 2395 ON with Vgs=3.0V (common-mode voltage at the chip output pads). The ON-resistance of the PMOS transistors 2390 and 2395 is very small due to the large PMOS Vgs even though a small, 3.3V PMOS device is used. It is noted that 3.3V devices have a larger Vt and a larger gate length compared to the 1.8V devices, both of which increase the resistance drain to source for a given bias condition. The large PMOS Vgs provided by the resistors negates these problems. Thus, the signal bandwidth is not affected.

It is further noted that the output voltage levels are only slightly affected by the small NMOS device current. Since only the PMOS transistor source diffusion is connected directly to the output pad, the PMOS transistor is protected from electrostatic discharge leading to the mux circuit 230 being protected from electrostatic discharge.

It is further noted that the sampling circuit 220 is protected from electrostatic discharge events by the PMOS transistors in the mux circuit 230. The small PMOS transistors used don't load the output pads so normal high speed operation is not affected.

As illustrated in FIG. 2, the output voltage from the mux circuit 230 is capacitively coupled into the sampling circuit 220 by capacitors 223 and 222. The capacitive coupling prevents current loading of the output stage through the mux circuit 230 and allows the biasing of the comparators at the optimum sampling level, maximizing the signal path frequency and voltage measurement accuracy. Also, the capacitors protect the active circuitry from relatively high input voltage.

As illustrated in FIG. 2, the sampling circuit 220 uses a set of comparators 224 that sample at a data rate that is less than the data rate of the high-definition multimedia interface 100. The sampling of the set of comparators 224 is controlled by clock phase selection circuit 229 in accordance with a timing clock received from the transmit phase locked loop circuit 120. The output from the set of comparators 224 is fed to a parallelizer 225, which converts the serial data to parallel data before it is fed to test circuit 210.

Figure 3:
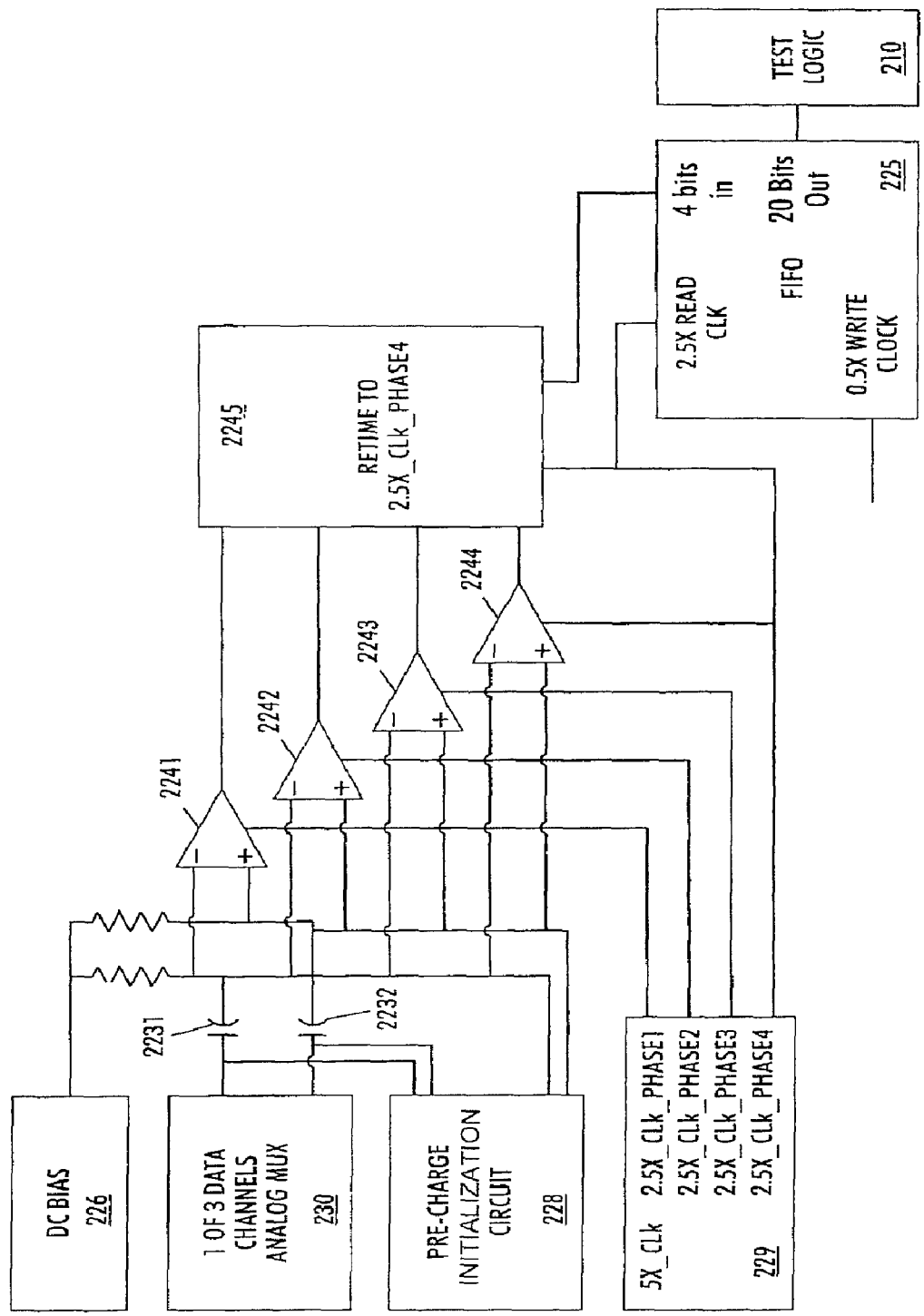
FIG. 3 illustrates a sampling circuit for a built-in self test circuit on an integrated chip for a high-definition multimedia interface according to the concepts of the present invention.

FIG. 3 provides a more detailed illustration of the sampling circuit 220. As illustrated in FIG. 3, the output voltage from the mux circuit 230 is capacitively coupled into the sampling circuit 220 by capacitors 2231 and 2232. The capacitive coupling prevents current loading of the output stage through the mux circuit 230 and allows the biasing of the comparators at the optimum sampling level, maximizing the signal path frequency and voltage measurement accuracy.

Since the capacitors 2231 and 2232 are relatively large (in terms of on-chip capacitance) considerable initialization time is required to get the proper voltage drop across the input capacitors 2231 and 2232. The large charge time translates into increased expense due to increased tester time. A precharge circuit 228 with low impedances is used to quickly place the proper charge onto the capacitors 2231 and 2232.

The sampling circuit 220 uses a set of comparators (2241, 2242, 2243, and 2244) that sample at a data rate that is less than the data rate of the high-definition multimedia interface 100. The set of comparators (2241, 2242, 2243, and 2244) is biased by DC bias circuit 226. The sampling of the set of comparators (2241, 2242, 2243, and 2244) is controlled by clock phase selection circuit 229 in accordance with data received from the transmit phase locked loop circuit 120. The output from the set of comparators (2241, 2242, 2243, and 2244) is retimed by retiming circuit 2245 before the data is fed to a parallelizer 225, which converts the serial data to parallel data before it is fed to test circuit 210.

The sampling circuit 220 allows the use of relatively large (hence slow) input devices to provide measurement accuracy via reduced noise and reduce offset voltages at the comparator inputs. The relatively slow sampling speed also allows the use of simple, low-power circuits for the comparators. This minimizes the area used. It is noted that the clock rate at which data is passed to the test circuit is further reduced by the retiming circuit. For example, the retiming circuit may reduce the clock rate at which data is passed to the test circuit to 1/20 of the transmit data rate. The reduction of the clock rate reduces the area of the test logic (small gates due to reduced loading) and facilitates the layout and synthesis of the logic block.

On the other hand, the test circuit 210 provides test automation, test completeness, and variable signal path delay compensation associated with both the serializer stage and the transmit output devices, and the test circuit itself. The test circuit 210 also performs a high-level analog functional test. Furthermore, the test circuit 210 can test the transmit channel between a source and a sink to provide a good/no-good signal determination.

As illustrated in FIG. 2, the output from sampling circuit 220 is fed to a buffer 215 in the test circuit 210. The test circuit 210 also includes a pattern generator 211 which generates the test patterns in accordance with data received from the transmit phase locked loop circuit 120. The test patterns are fed to a buffer 213 and the high-definition multimedia interface encoder 110.

The pattern in the buffer 213 is compared with the pattern in buffer 215 by pattern comparison circuit 214. The results of this comparison are fed to a finite state machine control logic block 212. The control finite state machine 212 provides control signals to the high-definition multimedia interface encoder 110, pattern generator 211, and clock phase selection circuit 229.

As noted above, conventionally, testing a transmitter is difficult due to the voltage levels, the high speed (i.e. transition rates of the waveforms and the small time period), and the variation in signal path delays in the analog transmit circuit. In addition, as noted above, any test circuitry must not compromise the measurement or the normal operations of the chip. These reasons are why testing is usually accomplished with special external test circuitry, i.e. a cable connected to an test load on a tester card.

In any analog circuit whose operation is not based on a clock signal, propagation time is a function of process, temperature, and voltage. In a production environment, the test voltage is, conventionally, set to the worst case condition while the temperature and device characteristics can vary widely; these factors lead to a wide variation in signal path delay. It is further noted that systematic delays between channels can negatively impact the selection of a pre-determined sampling phase. Conventionally, test routines have been written to vary the timing of the tester sampling clock feeding the sampling circuit; however, this increases tester time.

The present invention provides the use of multiple phases of the transmit clock for the test, the same clock used to transmit data. The test logic performs the transmit test multiple times, automatically selecting a different phase for each test. Either a single phase can be used for the test-pass criteria or multiple good test phases can be used. Testing for multiple good phases provides a better measurement of signal quality by determining the "eye-opening." Measuring the "eye" is a qualitative test to determine the quality of transmitted signal over a transmission channel.

The present invention also provides test completeness by using different test patterns. An all "1's" followed by all "0's" pattern can be used to generate a slowly varying signal to allow the accurate measurement of the output voltage levels. This is pattern can also be used in the testing of the chip for high-definition multimedia interface test compliance and trouble-shooting. A pseudorandom bit sequence pattern allows testing for data-dependent problems in the analog path. A programmable pattern allows the testing of the transmitter using patterns which yields worst case circuit behavior which in turn provides good test coverage.

The present invention further provides at-speed functional testing of the analog dynamic signal path plus portions of the digital logic. The correct operation of a phase-locked loop, a serializer path, a bandgap, a predriver stage, a transmit output circuit, a current reference, and a high-definition multimedia interface encoder are all tested. If the termination resistors are external to the chip, bond-wire integrity is also tested. The present invention could check complete chip functionality by comparing the chip data inputs to the transmitted data. It is noted that the functional tests can be done at various speeds; i.e., the functional test can be performed at the slowest speed, because a chip covering a wide range of operating frequencies may realize improper circuit operation at the slowest operating frequency.

The testing performed by the present invention is carried out in the control finite state machine 212 of FIG. 2. The control finite state machine 212 initializes a test by causing a test pattern to be selected. The high-definition multimedia interface encoder 110 is set to use the test pattern as an input and a bit is set to encode or not encode. The high-definition multimedia interface encoder 110 outputs to the serializer 130 which provides serial data to the analog transmit channel and to the buffer 213. At this time, the number of bits to be compared is selected, whether one good clock phase or multiple clock phases are tested, and whether the test is repeated multiple times to check for infrequent errors.

As the test starts, data is driven out on all data channels. Each channel is analyzed in a sequential fashion; i.e., one channel at a time. The appropriate mux circuit 230 is selected, and the associated data channel is supplied to the sampling circuit 220. Meanwhile, the test logic selects phase one of the transmit clock which is supplied to the sampling circuit 220. The transmit clock is used to generate four sampling clocks at ¼ the rate of the transmit clock. Each clock has a different phase and is used to sequentially clock the sampling comparators 224.

In one embodiment of the present invention, each comparator output may be retimed to a common clock phase and the data may be further retimed to 1/20 the transmit rate. The resulting M-bit data (at 1/M the transmit rate) is supplied to the buffer 215. The contents of the buffer 215 are automatically compared to the contents of the buffer 213 containing the original transmitted data stream as supplied by the high-definition multimedia interface encoder 110. Since there may be a variable timing delay, a retiming delay, and a delay in reading into the buffer 215 as compared to reading test data into the buffer 213, pattern comparison circuit 214 automatically compensates for the delays and aligns the two patterns so the bit patterns can be compared to prevent false data comparisons. More specifically, pattern comparison circuit 214 compares the contents of the two buffers (215 and 213), and if there is no match, the sampled data (buffer 215) is shifted and the comparison is repeated. The comparison process is repeated until there is a data match or until the maximum number of tries is met.

It is further noted that the sampling circuit receives phase 1 of the transmit clock initially. The other phases are then tested in a serial, sequential fashion. The phases that provide a test-pass signal are stored in a register. The test criteria can be one good phase (a phase where the contents of the two buffers (215 and 213) match) found or multiple good phases found.

It is also noted that using multiple good phases (sampled data (buffer 215) matches the data transmitted (buffer 213) for the phase used) for the test criteria provides an estimation of the eye-opening. The numbers of errors that occur in a particular data comparison are stored in a register. This information can be used as a bit error rate test at the system level.

In operation, the present invention enables the inputs to the high-definition multimedia interface encoder 110 to be muxed between normal data inputs and the pattern generation logic of test circuit 210. The pattern generation logic of test circuit 210 can either output pseudorandom bit sequence data or data from registers, depending on the test being performed. The high-definition multimedia interface encoder 110 can be bypassed so un-encoded data can be transmitted if desired. The output of the high-definition multimedia interface encoder 110 is serialized into a maximum 1.6 GHz serial data stream. The serial data stream is converted to a differential current that drives loads.

The sampling circuit samples the transmitter output and conditions the data for the testing circuit. The testing circuit retimes the data from the sampling circuit to the character rate clock (1× clock). This data is compared to the data that was input to the analog serializer. The recovered data bits are time-shifted automatically until a pattern match is found. If no time-shift is found that produces zero bit errors, the logic will select another sampling phase for the analog data sampler.

Since conventional high-definition multimedia interface signals are referenced to 3.3 Volts, the outputs cannot be sampled directly. To provide the sampling, the present invention capacitively couples the voltage to the sampling circuit using capacitors. As noted above, a DC bias circuit is used to bias the sampling comparators at the optimum DC bias level. Since the capacitors are relatively large (in terms of on-chip capacitance) considerable initialization time is required to get the proper voltage drop across the input capacitors. The large charge time translates into increased expense due to increased tester time. A pre-charge circuit with low impedances is used to quickly place the proper charge onto the capacitors.

An analog mux is used to select between channels. In one embodiment, the 5× (five times the character rate) transmit clock is divided into a four-phase 2.5× clock. This allows the data to be sampled at one-fourth the serial data transmit rate (2.5 times the character clock) using four comparators, simplifying the comparator speed requirements and increasing timing margins by a factor of 4 in each sampling branch.

Due to the variable time delay in the analog sampling portion of the testing circuit, it is necessary to vary the phase of the clock coming from the transmit phase-locked loop. To realize an automated at-speed test, the proper transmit clock phase is automatically selected, by starting with phase 1 and measuring the bit error rate. If phase 1 does not produce zero bit errors, phase 2 is selected. The automatic phase selection continues until either a specific phase selection produces zero bit errors or all phases have been tried.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A high-definition multimedia interface circuit, comprising:
   a test pattern generator to generate a test pattern;
   a high-definition multimedia interface encoder to encode the test pattern;
   an output circuit, operatively connected to the high-definition multimedia interface encoder, to produce high frequency data from the encoded test pattern;
   a capacitive coupler, operatively connected to the output circuit;
   a sampling circuit, operatively connected to the capacitive coupler, to produce sampled data corresponding to the high frequency data; and
   a test circuit, operatively connected to the sampling circuit, to compare the sampled data with the test pattern.

2. The high-definition multimedia interface circuit as claimed in claim 1, wherein said sampling circuit includes a set of comparators to sample at a data rate that is less than the data rate of the high frequency data.

3. The high-definition multimedia interface circuit as claimed in claim 1, wherein said sampling circuit includes a set of comparators to sample at a data rate that is less than the data rate of the high frequency data and a retiming circuit to further reduce the data rate of the sampled data.

4. The high-definition multimedia interface circuit as claimed in claim 1, wherein said sampling circuit includes a set of comparators to sample at a data rate that is less than the data rate of the high frequency data and a parallelizer circuit to convert the sampled data to parallel data.

5. A high-definition multimedia interface circuit, comprising:
   a test pattern generator to generate a test pattern;
   a high-definition multimedia interface encoder to encode the test pattern;
   an output circuit, operatively connected to said high-definition multimedia interface encoder, to produce high frequency data from the encoded test pattern;
   a sampling circuit, capacitively connected to said output circuit, to produce sampled data corresponding to the high frequency data having a clock rate less than a clock rate of the high frequency data; and
   a test circuit, operatively connected to said sampling circuit, to compare the sampled data with the test pattern.

6. The high-definition multimedia interface circuit as claimed in claim 5, wherein said sampling circuit includes a set of comparators to sample at a data rate that is less than the data rate of the high frequency data.

7. The high-definition multimedia interface circuit as claimed in claim 5, wherein said sampling circuit includes a set of comparators to sample at a data rate that is less than the data rate of the high frequency data and a retiming circuit to further reduce the data rate of the sampled data.

8. The high-definition multimedia interface circuit as claimed in claim 5, wherein said sampling circuit includes a set of comparators to sample at a data rate that is less than the data rate of the high frequency data and a parallelizer circuit to convert the sampled data to parallel data.

9. A high-definition multimedia interface circuit, comprising:
   a test pattern generator to generate a test pattern;
   a high-definition multimedia interface encoder to produce a plurality of channels of encoded data from the test pattern;
   an output circuit, operatively connected to said high-definition multimedia interface encoder, to produce a plurality of channels of high frequency data from the plurality of channels of encoded data;
   a multiplexer, operatively connected to said output circuit, to select a channel for sampling; a capacitive coupler, operatively connected to said multiplexer;
   a sampling circuit, operatively connected to said capacitive coupler, to produce sampled data corresponding to the high frequency data having a clock rate less than a clock rate of the high frequency data; and
   a test circuit, operatively connected to said sampling circuit, to compare the sampled data with the test pattern.

10. The high-definition multimedia interface circuit as claimed in claim 9, wherein said multiplexer includes a transistor in each signal path and a resistor connected across a gate and source of said transistor.

11. The high-definition multimedia interface circuit as claimed in claim 9, wherein said sampling circuit includes a set of comparators to sample at a data rate that is less than the data rate of the high frequency data.

12. The high-definition multimedia interface circuit as claimed in claim 9, wherein said sampling circuit includes a set of comparators to sample at a data rate that is less than the data rate of the high frequency data and a retiming circuit to further reduce the data rate of the sampled data.

13. The high-definition multimedia interface circuit as claimed in claim 9, wherein said sampling circuit includes a set of comparators to sample at a data rate that is less than the data rate of the high frequency data and a parallelizer circuit to convert the sampled data to parallel data.

14. The high-definition multimedia interface circuit as claimed in claim 9, wherein said sampling circuit includes a set of comparators to sample at a data rate that is less than the data rate of the high frequency data and a bias circuit to bias the input voltage to said set of comparators.

15. The high-definition multimedia interface circuit as claimed in claim 9, further comprising a pre-charge initialization circuit to pre-charge said capacitive coupler.

16. The high-definition multimedia interface circuit as claimed in claim 9, wherein said capacitive coupler is a pair of capacitors.

* * * * *